United States Patent
Mitsuhashi et al.

(10) Patent No.: US 6,815,377 B2
(45) Date of Patent: Nov. 9, 2004

(54) LASER ANNEALING METHOD AND APPARATUS FOR DETERMINING LASER ANNEALING CONDITIONS

(75) Inventors: Hiroshi Mitsuhashi, Kumagaya (JP); Atsushi Nakamura, Green (SG)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 10/219,264

(22) Filed: Aug. 16, 2002

(65) Prior Publication Data

US 2003/0036251 A1 Feb. 20, 2003

(30) Foreign Application Priority Data

Aug. 17, 2001 (JP) ........................................ 2001-248094

(51) Int. Cl.$^7$ ............................................. H01L 21/26
(52) U.S. Cl. ...................... 438/795; 438/795; 438/799; 438/118
(58) Field of Search .......................... 438/16, 400, 795, 438/796, 797, 798, 118; 257/758

(56) References Cited

U.S. PATENT DOCUMENTS 6,080,236 A * 6/2000 McCulloch et al. ........... 117/4

* cited by examiner

*Primary Examiner*—Long Pham
*Assistant Examiner*—Nathan W. Ha
(74) *Attorney, Agent, or Firm*—Oblon, Spivak, McClelland, Maier & Neustadt, P.C.

(57) ABSTRACT

A laser annealing method includes preparing a plurality of polycrystalline silicon film samples having different grains sizes, obtaining the energy density condition corresponding to the polycrystalline silicon film sample having the highest degree of scattering, adding a certain value of the energy density to the energy density condition obtained in the preceding step so as to determine a set value of the energy density, and irradiating the amorphous silicon thin film with a laser beam at the set value of the energy density determined in the preceding step so as to carry out the laser annealing.

17 Claims, 3 Drawing Sheets

LASER ANNEALING METHOD AND APPARATUS FOR DETERMINING LASER ANNEALING CONDITIONS

CROSS-REFERENCE TO RELATED APPLICATIONS

This application is based upon and claims the benefit of priority from the prior Japanese Patent Application No. 20015-248094, filed Aug. 17, 2001, the entire contents of which are incorporated herein by reference.

BACKGROUND OF THE INVENTION

1. Field of the Invention

The present invention relates to a laser annealing method and an apparatus for determining the laser annealing conditions.

2. Description of the Related Art

Presently, liquid crystal displays (LCD) provided with an insulated gate type thin film transistor (TFT) using an amorphous silicon (a-Si) as a pixel switching element are being produced on a mass production basis. However, a TFT using an a-Si having a low electric field mobility ($\mu$FE), which is not higher than 1 cm$^2$/Vs, is insufficient for realizing a high performance display of, for example, high precision and high speed.

On the other hand, an electric field mobility $\mu$FE of about 100 to 200 cm$^2$/Vs has been obtained in an experimental TFT, by using a polycrystalline silicon prepared by laser annealing, in which an a-Si is irradiated with an excimer laser. This is expected to realize a high performance display of, for example, high precision, high operating speed, and to also integrally contain a driving circuit.

In excimer laser annealing (ELA), an a-Si deposited on a glass substrate is irradiated with an excimer laser so as to convert the a-Si into a polycrystalline silicon. In this method, the excimer laser beam has, for example, a length of 250 mm and a width of 0.4 mm on the surface of the a-Si. The pulse beam is oscillated at 300 Hz, and the region irradiated with each pulse is gradually moved so as to convert the a-Si into a polycrystalline silicon. The liquid crystal displays equipped with a TFT prepared as above are collectively called low temperature polycrystalline silicon LCDs.

The grain size of the polycrystalline silicon, which is the factor for determining the electric field mobility $\mu$FE of the polycrystalline silicon TFT, is greatly dependent on the energy density, or fluence of the irradiating laser beam. To be more specific, with an increase in the fluence, the grain size of the polycrystalline silicon is also increased. In order to obtain a high performance polycrystalline silicon having an electric field mobility $\mu$FE not lower than 100 cm$^2$/Vs, required is a fluence higher than the value of a certain fluence, F1. Incidentally, "fluence" denotes the value obtained by integrating the laser irradiation amount per unit area with time.

If the fluence value is increased to exceed F1, the grain size of the polycrystalline silicon is further increased. However, if the value of the fluence is further increased to exceed F2, the polycrystalline silicon grains are converted into microcrystalline grains. It is impossible to obtain a TFT having the desired characteristics by using such a microcrystalline silicon.

The grain size of polycrystalline silicon can be determined by a so-called "Secco-etching method", in which the polycrystalline silicon is etched with a Secco-etching solution and the etched surface is observed and measured by a scanning electron microscope. By using this method, a fluence value of a laser corresponding to a region in which the grain size of the polycrystalline silicon is somewhat large is selected. The fluence value thus selected falls between F1 and F2. It is thus possible to obtain a TFT having a desired electric field mobility, even if the laser oscillation intensity greatly varies.

However, Secco-etching requires the steps of cracking the substrate, applying an etching and observing the etched surface with an FE-SEM and, thus, it takes a long time to determine the grain size. Therefore, Secco-etching leads to low productivity.

Also, it is known to the art that the optimum condition of the laser is changed with increase in the number of shots after the gas replacement in the laser device, making it necessary to obtain the optimum condition frequently. Naturally, it is impractical to employ Secco-etching whenever the optimum condition is obtained.

BRIEF SUMMARY OF THE INVENTION

An object of the present invention is to provide a laser annealing method that permits obtaining a TFT having a high mobility over the entire substrate surface with a high yield.

Another object of the present invention is to provide an apparatus for determining the condition of the laser annealing.

According to an aspect of the present invention, there is provided a laser annealing method, in which an amorphous silicon thin film is irradiated with a laser beam so as to convert the amorphous silicon into polycrystalline silicon, comprising: irradiating an amorphous silicon film sample with a laser beam for determining the condition under various energy density conditions so as to prepare a plurality of polycrystalline silicon film samples having different grain sizes; allowing a light beam having a wavelength region including a visible wavelength in a center to be incident on the polycrystalline silicon film at a first angle relative to a line normal to a surface of the polycrystalline silicon film and detecting scattered light or reflected light at a second angle corresponding to a direction different from a direction of a regular reflection of the incident light so as to measure degrees of surface scattering of the plural polycrystalline silicon film samples and, thus, to obtain energy density condition corresponding to the polycrystalline silicon film sample having highest degree of scattering; adding a certain value of energy density to the energy density condition obtained in the preceding step so as to determine a set value of the energy density; and irradiating the amorphous silicon thin film with a laser beam at the set value of the energy density determined in the preceding step so as to carry out the laser annealing.

According to another aspect of the present invention, there is provided an apparatus for determining the condition used in a laser annealing method, in which an amorphous silicon thin film is irradiated with a laser beam so as to convert the amorphous silicon into a polycrystalline silicon, comprising: a light source arranged to permit a light beam having a wavelength region including a visible wavelength in a center to be incident on a plurality of polycrystalline silicon film samples having different grain sizes, the polycrystalline silicon film samples being prepared by irradiating amorphous silicon film samples with a laser beam for determining the condition under various energy density conditions, at a first angle relative to a line normal to a surface of the polycrystalline silicon film sample; a detector arranged to permit the scattered light or reflected light from the polycrystalline silicon film sample to be detected at a second angle corresponding to a direction different from a direction of a regular reflection of the incident light; a mechanism for obtaining energy density condition corresponding to the polycrystalline silicon film sample having highest degree of scattering by measuring degree of surface scattering of the plural polycrystalline silicon film samples by the detector; and a mechanism for determining a set value of the energy density by adding a certain value of the energy density to the energy density condition obtained by the mechanism for obtaining the energy density condition.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the present invention, and together with the general description given above and the detailed description of the embodiments given below, serve to explain the principles of the present invention.

DETAILED DESCRIPTION OF THE INVENTION

Figure 1:
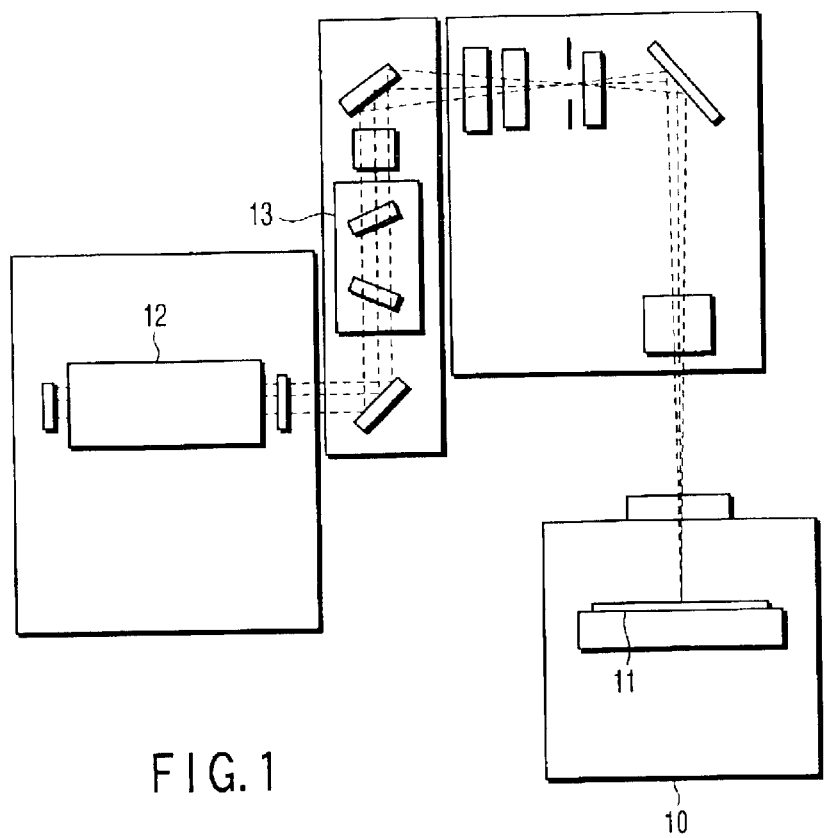
FIG. 1 shows the construction of an excimer laser annealing apparatus used in embodiment 1 of the present invention.

It is known to the art that, if an amorphous silicon layer on the surface of a substrate is subjected to laser annealing while varying the fluence, the surface irregularity is rendered most prominent at the time when the average grain size of the polycrystalline silicon is increased to 0.3 $\mu$m, so as to scatter light. Therefore, as a method of obtaining the optimum laser condition for converting an amorphous silicon thin film into a polycrystalline silicon thin film by means of the laser beam irradiation, laser annealing utilizing this condition can be used.

F1 referred to previously exactly corresponds to the condition for most greatly scattering the light, and it is possible to find the optimum value of F1 at that time regardless of state of the laser by applying excimer laser annealing (ELA) to a single substrate by changing the value of fluence and by observing the substrate by naked eye. The margin of ELA falls within a range of between F1 and F2, and it is most desirable to select the fluence setting of ELA to be midway between F1 and F2.

F1 is changed depending on the state of the laser. However, the value of (F2–F1) is substantially constant and, thus, it is possible to obtain the optimum ELA by adding a certain fluence value to F1.

However, the above method can be employed only in the case where the size of the substrate is not larger than 550 mm×670 mm. If the substrate is larger than this, it is impossible to manually hold the substrate, making it difficult to observe the substrate by naked eye.

The present inventors have studied the relationship between the light scattering light amount from the polycrystalline silicon layer, the surface morphology, the grain size of the polycrystalline silicon, and the characteristics of the manufactured transistor, in detail. It has been found that it is possible, with a sensor set at a certain angle, to obtain exactly the same result as that of observation with the naked eye of the operator, by detecting the light incident at a certain incident angle on the polycrystalline silicon formed by the laser annealing, thus arriving at the present invention.

It is considered reasonable to understand that the surface projection of the polycrystalline silicon layer has the largest height when the polycrystalline silicon has an average grain size of 0.3 $\mu$m because the laser beam has a wavelength of 0.3 $\mu$m and the laser beam passing through the optical system has an intensity distribution at an interval of 0.3 $\mu$m because of the interference of the light. Further, the surface projection is not conical but in the shape of a collapsed cone. Note that the intensity distribution of the laser beam is inclined in the scanning direction so as to form a temperature gradient in the scanning direction, with the result that the conical shape is collapsed in the scanning direction.

If a light beam is incident on the surface of such a polycrystalline silicon film, the scattering of the light beam is intensified in a certain direction, different from the direction of the regular reflection. It is possible to find the condition for the highest light scattering with a very high accuracy by arranging a sensor at that angle.

In the laser annealing method of the present invention, it is desirable to set the incident angle of the incident light to fall within a range of between 40° and 50° and to detect the scattered light or the reflected light in a direction of 10° to 35° or 55° to 80°, particularly in the direction of 30°, on the opposite side of the incident light relative to a line normal to the substrate. If the scattered light or the reflected light is detected in the direction falling within the range noted above, it is possible to obtain the highest condition of the light reflection or the light scattering with the highest accuracy.

In the laser annealing method of the present invention, it is possible to set the value of the specified energy density that is added to the energy density corresponding to the highest condition of the light reflection or the light scattering, to fall within a range of, for example, between 10 mJ/cm$^2$ and 40 mJ/cm$^2$. The obtained energy density is midway between F1 and F2, particularly close to the center value between F1 and F2. It is possible to carry out optimum laser annealing under the condition obtained by adding the energy density falling within the range noted above to the condition of the energy density corresponding to the maximum scattering intensity.

The value of the specified energy density to be added is changed depending on the thickness of the amorphous silicon film used for determining the condition. To be more specific, the value of the specified energy density that is to be added is decreased with increases in the thickness of the amorphous silicon film and is increased with decrease in the thickness of the amorphous silicon film.

For example, where the ratio ds/d0 of the average value ds in the thickness of the amorphous silicon film sample to the standard or target value d0 in the thickness of the amorphous silicon thin film to which laser annealing is applied is not smaller than 0.9 and smaller than 0.94, the value of the energy density to be added is 10 mJ/cm². Where the ds/d0 ratio noted above is not smaller than 0.94 and smaller than 0.98, the value of the specified energy density to be added is 5 mJ/cm². Where the ds/d0 ratio noted above is not smaller than 0.98 and smaller than 1.02, the value of the specified energy density to be added is 10 mj/cm² to 40 mJ/cm². Where the ds/d0 ratio noted above is not smaller than 1.02 and smaller than 1.06, the value of the specified energy density to be added is 5 mJ/cm². Where the ds/d0 ratio noted above is not smaller than 1.06 and smaller than 1.10, the value of the specified energy density to be added is −10 mJ/cm². Further, where the ds/d0 ratio noted above is smaller than 0.90 or exceeds 1.10, it is desirable not to use the amorphous silicon thin film as a substrate for determining the condition.

It is possible to use the attenuator transmittance of the laser beam in place of the energy density of the laser beam because the energy density is proportional to the attenuator transmittance.

In the laser annealing method of the present invention, it is desirable to form a plurality of polycrystalline silicon film samples having various grain sizes on a single substrate by irradiating an amorphous silicon film sample with a laser beam for determining the conditions under various energy density conditions. In this case, it is possible to determine very easily and efficiently the set value of the energy density of the laser beam, i.e., the laser annealing conditions.

In the apparatus according to one embodiment of the present invention for determining the laser annealing conditions, it is possible to use, as the means for detecting the scattered light or the reflected light, a photovoltaic element selected from the group consisting of a photodiode, a CCD, a MOS transistor, a photomultiplier and a biplanar phototube, as well as a chromameter or a colorimater using the photovoltaic element noted above.

According to one embodiment of the present invention of the construction described above, it is possible to find the condition for the highest light scattering with a very high accuracy by detecting the light incident at a certain incident angle on a polycrystalline silicon layer converted from an amorphous silicon layer by the laser annealing with a sensor at a certain angle. Also, it is possible to produce TFT's having a high mobility over the entire substrate surface uniformly on the mass production basis with a high productivity by irradiating an amorphous silicon thin film with a laser beam for the laser annealing, the laser beam irradiation being performed by using a set value of the energy density obtained by adding a certain value of the energy density to the condition of the energy density corresponding to the maximum scattering intensity thus obtained. As a result, it has been made possible to manufacture low temperature polycrystalline silicon liquid crystal displays with a high yield on a mass production basis, though it was difficult in the past to manufacture such liquid crystal displays on the mass production basis.

Some embodiments of the present invention will now be described with reference to the accompanying drawings.

Embodiment 1

After the gas replacement for an excimer laser, an experiment for determining the optimum conditions for the laser annealing of an amorphous silicon was conducted under the conditions described below.

In the first step, an a-Si thin film (not shown) deposited to a thickness of 47 nm on a glass substrate 11 arranged within an annealing chamber 10 was irradiated with a laser beam released from a laser tube 12 of a laser annealing apparatus shown in FIG. 1. The irradiation was performed under 15 conditions in terms of the transmittance (attenuator transmittance) of the laser beam falling within a range of between 70% and 98%. To be more specific, the irradiation was performed with a width of 20 mm at a pitch of 1 mm so that the angle of a variable attenuator 13 was adjusted so as to increase the transmittance (attenuator transmittance) of the laser beam by 2% each time so as to set up the 15 conditions noted above.

Figure 2:
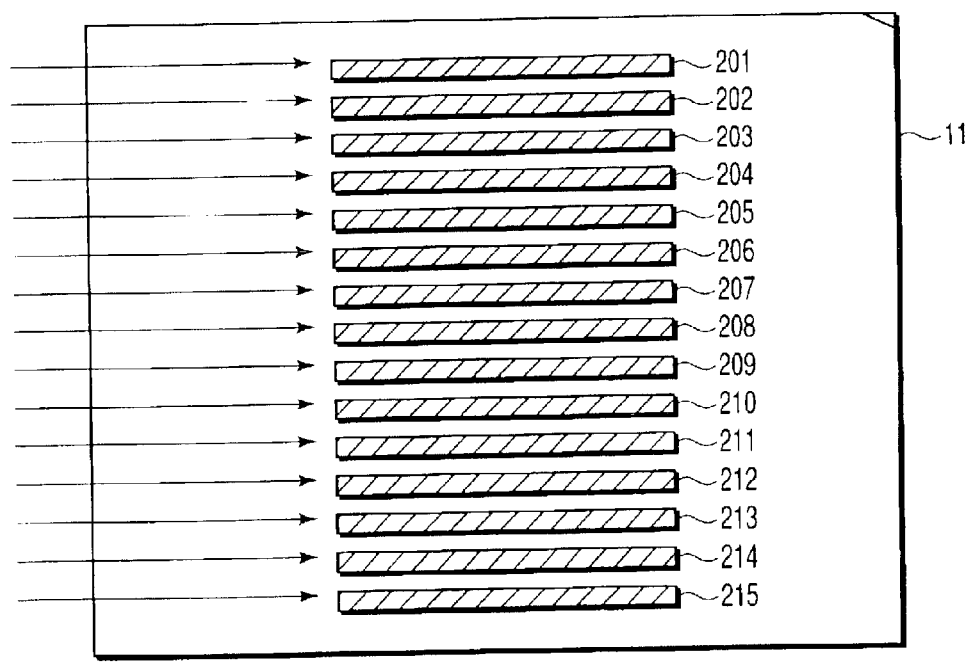
FIG. 2 is for explaining the method for determining the laser annealing condition according to one embodiment of the present invention.

The substrate 11 was sized at 400 mm×500 mm, the forwarding pitch of the stage having the substrate mounted thereon was set at 20 μm, and the wavelength of the laser oscillation was set at 300 Hz. FIG. 2 shows the state of the laser irradiation. Reference numerals 201 to 214 shown in FIG. 2 denote the irradiating regions (20 mm×250 mm) in which the a-Si thin film was irradiated with a laser beam whose transmittance was controlled by the variable attenuator 13.

In this embodiment, the condition that permits the maximum scattering by the observation with the naked eye was a transmittance of 80%. The reflected light from the substrate 11 was measured by using a spectroscopic variable angle colorimater. The colorimater was mounted to an optical microscope with a remote control stage. It is possible to measure automatically L* of the scattered light of the laser beam having each transmittance by utilizing the stage function of the microscope. Also, it is possible for the colorimater to be mounted to the annealing chamber 10. Used as the detection signal was L* in "CIE (Commission International de l'Eclairage) 1976L*a*b* color space. L* is related to Y in the XYZ color display system, as denoted by the formula given below:

$$L^* = 116(Y/Y_0)^{1/3} - 16$$

Since Y coincides with the luminous reflectance, it is possible to use L* in place of the scattering intensity by the naked eye.

Figure 3:
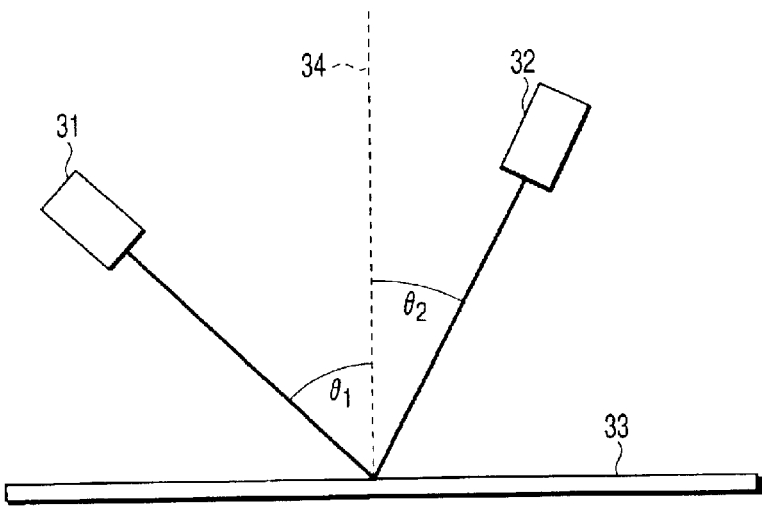
FIG. 3 shows a measuring method of L* used for determining the laser annealing condition according to one embodiment of the present invention.

L* was measured in respect of samples differing from each other in the attenuator transmittance, with the incident angle θ1 and the reflecting angle φ2 shown in FIG. 3 used as parameters. Incidentally, FIG. 3 shows a light source 31, a detector 32, a sample surface 33, and a line 34 normal to the sample surface 33.

Figure 4A:
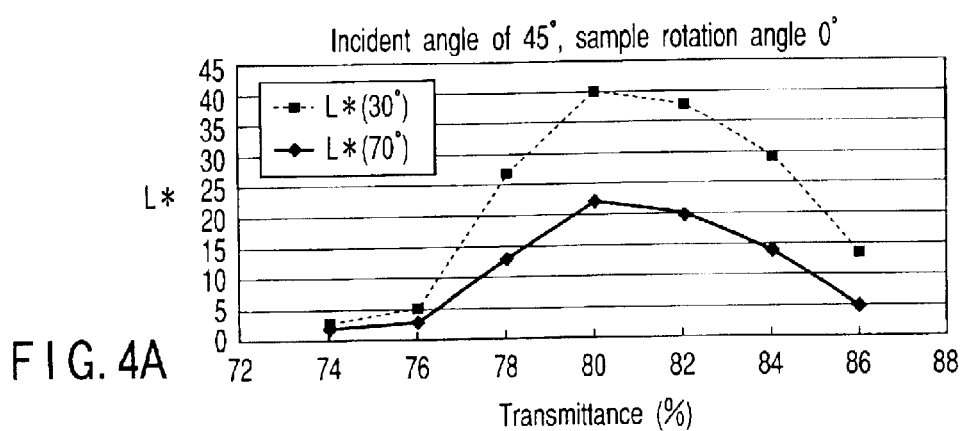
FIGS. 4A and 4B are graphs each showing the change in the value of L* relative to the attenuator transmittance obtained from a spectroscopic variable angle colorimater in embodiment 1 of the present invention.
Figure 4B:
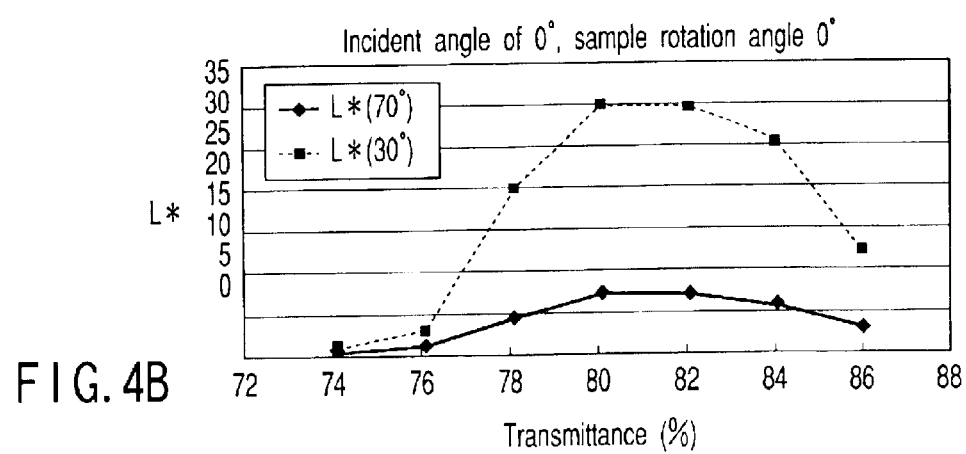

FIGS. 4A and 4B show the results in respect of the measured values of L*. As apparent from FIGS. 4A and 4B, a high signal output can be obtained in the case where the reflecting angle θ2 based on the normal line 34 is set at 30°, compared with the case where the reflecting angle θ2 noted above is set at 70°. On the other hand, the difference due to the attenuator transmittance is greater in the case where the incident angle θ1 is set at 45° than in the case where the incident angle θ1 is set at 0°, though the difference between 0° and 45° is not significantly large.

Under the circumstances, it is reasonable to state that the incident angle θ1 of 45° and the reflecting angle θ2 of 30° provide excellent measuring conditions. In FIG. 3, the light source 31 and the detector 32 are disposed on the same plane, and particular plane is perpendicular to the major axis of the beam.

Under the conditions given above, the maximum signal was obtained when the attenuator transmittance was set at 80%, which coincides with the result of observation by the naked eye. The attenuator transmittance can be converted into the fluence by multiplying the transmittance by 4.5 because the fluence under the attenuator transmittance of 100% is 450 mJ/cm$^2$. It follows that the attenuator transmittance of 80% is equal to the fluence of 360 mJ/cm$^2$.

Embodiment 2

This embodiment is directed to the method of preparing a TFT array for driving a liquid crystal display. The thin film used was prepared by forming an undercoat layer consisting of SiN$_x$ and SiO$_x$ on a glass substrate by a plasma CVD method, followed by forming an a-Si film to a thickness of 49 nm on the undercoat layer by a plasma CVD method. The substrate was sized at 400 mm×500 mm.

The a-Si film thus formed was subjected to a heat treatment at 500° C. for 10 minutes so as to lower the hydrogen concentration in the film. Then, the thickness of the a-Si film was obtained by the spectroeripso method, with the result that the actual thickness of the a-Si film was found to be 49.5 nm.

Then, the condition was determined by utilizing the method of embodiment 1. It has been found that L* was rendered maximum in the sample having the attenuator transmittance of 80%.

Then, used was a linear beam of an excimer laser having an irradiating size of 250 mm×0.4 mm, the attenuator transmittance of the laser beam used was set at 85% by adding 5% to 80% noted above, and the overlap was set at 95%. The laser beam was operated at 300 Hz, and the XY stage having the substrate disposed thereon was moved at a speed of 6 mm/s.

Figure 5:
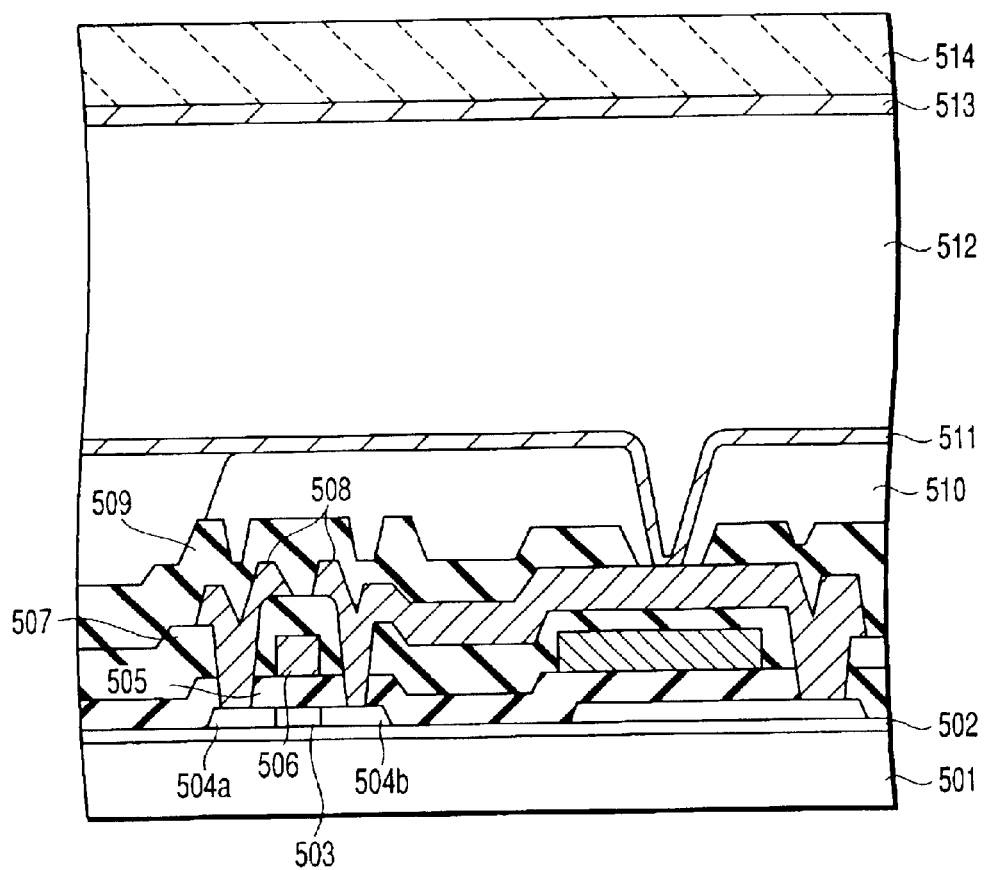
FIG. 5 is a cross sectional view showing the construction of a polycrystalline silicon active matrix type liquid crystal display obtained in embodiment 2 of the present invention.

A thin film transistor was prepared by the lithography technology by using a polycrystalline silicon film obtained by the laser annealing described above, and an active matrix liquid crystal display device was prepared by using the thin film transistor thus prepared. FIG. 5 shows the construction of the active matrix liquid crystal display device thus prepared.

As shown in FIG. 5, the active matrix liquid crystal display device comprises a glass substrate 501, a counter glass substrate 514 arranged to face the glass substrate 501, and a liquid crystal 512 arranged between the glass substrate 501 and the counter substrate 514. The glass substrate 501 is provided with a TFT, a color filter 510 and a pixel electrode 511. On the other hand, the counter glass substrate 514 is provided with a counter electrode 513.

An undercoat layer 502 is formed on the surface of the glass substrate 501, and an amorphous silicon layer is formed on the undercoat layer 502, said amorphous silicon layer being converted into a polycrystalline silicon layer by the laser annealing method of the present invention.

The polycrystalline silicon layer obtained by the laser annealing is used for forming the TFT. To be more specific, a polycrystalline silicon source region 504a and a polycrystalline silicon drain region 504b are formed on both sides of a semiconductor layer 504a formed of polycrystalline silicon by allowing both side regions of the semiconductor layer 504a to be doped with an impurity, and a gate electrode 506 is formed above the semiconductor layer 503 with a gate insulating oxide film 505 interposed therebetween.

Source/drain electrodes 508 are connected to the source region 504a and the drain region 504b, respectively, through connecting holes formed in an interlayer insulating layer 507. Also, a protective film 509 is formed to cover the source/drain electrodes 508. Further, the color filter 510 and the pixel electrode 511 are formed to cover the protective film 509.

Since TFT's exhibiting excellent characteristics can be produced on the mass production basis by using the laser annealing method of the present invention as described previously, it is possible to manufacture a high quality liquid crystal display device with a very high yield.

As described above in detail, according to the present invention, it is possible to find the condition of the highest light scattering with a very high accuracy by detecting the light incident at a certain incident angle on a polycrystalline silicon layer formed by the laser annealing with a sensor in a certain angle. Also, it is possible to produce uniformly TFT's having a high mobility on the entire substrate on the mass production basis with a high productivity by carrying out a laser annealing, in which an amorphous silicon thin film is irradiated with a laser beam by using a set value of the energy density obtained by adding a certain energy density value to the energy density condition corresponding to the maximum scattering density thus obtained. It follows that the present invention has made it possible to manufacture low temperature polycrystalline silicon liquid crystal displays on the mass production basis with a high yield and a low cost, though it was difficult in the past to manufacture the low temperature polycrystalline silicon liquid crystal display on the mass production basis.

Additional advantages and modifications will readily occur to those skilled in the art. Therefore, the present invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A laser annealing method, in which an amorphous silicon thin film to be converted from amorphous silicon into polycrystalline silicon is irradiated with a laser beam so as to convert the amorphous silicon into polycrystalline silicon, comprising:

irradiating an amorphous silicon film sample with a laser beam under various energy density conditions so as to prepare a plurality of polycrystalline silicon film samples having different grain sizes, each polycrystalline silicon film sample having a corresponding energy density condition;

allowing a light beam having a wavelength region including a visible wavelength in a center to be incident on said polycrystalline silicon film samples at a first angle relative to a line normal to a surface of the polycrystalline silicon film and detecting scattered light or reflected light at a second angle corresponding to a direction different from a direction of a regular reflection of said incident light so as to measure degrees of surface scattering of said plural polycrystalline silicon film samples and, thus, to obtain an energy density condition corresponding to a polycrystalline silicon film sample having a highest degree of scattering;

adding a certain value of energy density to the energy density condition obtained in the preceding step so as to determine a set value of the energy density; and irradiating said amorphous silicon thin film to be converted from amorphous silicon into polycrystalline silicon with a laser beam at the set value of the energy density determined in the preceding step so as to carry out the laser annealing.

2. The laser annealing method according to claim 1, wherein the first angle of said incident light is 40 to 50°, and said scattered light or reflected light is detected at the second angle of 10 to 35° or 55 to 80° on the opposite side of said incident light relative to a line normal to said polycrystalline silicon film.

3. The laser annealing method according to claim 1, wherein the value of the energy density added to said energy density condition falls within a range of between 10 mJ/cm$^2$ and 40 mJ/cm$^2$.

4. The laser annealing method according to claim 1, wherein the value of the energy density added to said energy density condition is changed depending on the thickness of said amorphous silicon film sample.

5. The laser annealing method according to claim 4, wherein the value of the energy density added to said energy density condition is decreased with increase in the thickness of said amorphous silicon film sample.

6. The laser annealing method according to claim 4, wherein the value of the energy density added to said energy density condition is 10 mJ/cm$^2$ in the case where ratio ds/d0 of average value ds in a thickness of the amorphous silicon film sample to standard value d0 in a thickness of the amorphous silicon thin film to which a laser annealing is applied is not smaller than 0.9 and smaller than 0.94, is 5 mJ/cm$^2$ in the case where ds/d0 ratio noted above is not smaller than 0.94 and smaller than 0.98, is 10 mJ/cm$^2$ to 40 ml/cm$^2$ in the case where ds/d0 ratio noted above is not smaller than 0.98 and smaller than 1.02, is −5 mJ/cm$^2$ in the case where ds/d0 ratio noted above is not smaller than 1.02 and smaller than 1.06, and is −10 mJ/cm$^2$ in the case where ds/d0 ratio noted above is not smaller than 1.06 and smaller than 1.10 and, where ds/d0 ratio noted above is smaller than 0.90 or exceeds 1.10, the amorphous silicon thin film is not used as a substrate for determining the condition.

7. The laser annealing method according to claim 1, wherein the attenuator transmittance of the laser beam is used in place of the energy density of said laser beam.

8. The laser annealing method according to claim 1, wherein a plurality of said polycrystalline silicon film samples having various grain sizes are formed on a single substrate.

9. An apparatus for determining a condition used in a laser annealing method, in which an amorphous silicon thin film is irradiated with a laser beam so as to convert said amorphous silicon into a polycrystalline silicon, comprising:

a light source arranged to permit a light beam having a wavelength region including a visible wavelength in a center to be incident on a plurality of polycrystalline silicon film samples having different grain sizes, said polycrystalline silicon film samples being prepared by irradiating amorphous silicon film samples with a laser beam under various energy density conditions, each polycrystalline silicon film sample having a corresponding energy density condition, and said light beam being incident at a first angle relative to a line normal to a surface of the polycrystalline silicon film sample;

a detector arranged to permit scattered light or reflected light from said polycrystalline silicon film sample to be detected at a second angle corresponding to a direction different from a direction of a regular reflection of said incident light;

a mechanism configured to obtain an energy density condition corresponding to the polycrystalline silicon film sample having a highest degree of scattering by measuring degrees of surface scattering of said plural polycrystalline silicon film samples by said detector; and a mechanism configured to determine a set value of the energy density by adding a certain value of the energy density to the energy density condition obtained by said mechanism configured to obtain the energy density condition.

10. The apparatus for determining the laser annealing condition according to claim 9, wherein the first angle of said incident light is 40 to 50°, and said scattered light or reflected light is detected at the second angle in a direction of 10 to 35° or 55 to 80° on the opposite side of said incident light relative to a line normal to said polycrystalline silicon film.

11. The apparatus for determining the laser annealing condition according to claim 9, wherein said detector is formed of a photovoltaic element selected from the group consisting of a photodiode, a CCD, a MOS transistor, a photomultiplier, and a biplanar phototube, or a chromameter or a colorimater using said photovoltaic element.

12. The apparatus for determining the laser annealing condition according to claim 10, wherein the value of the energy density added to said energy density condition falls within a range of between 10 mJ/cm$^2$ and 40 mJ/cm$^2$.

13. The apparatus for determining the laser annealing condition according to claim 9, wherein the value of the energy density added to said energy density condition is changed depending on the thickness of said amorphous silicon film sample.

14. The apparatus for determining the laser annealing condition according to claim 13, wherein the value of the energy density added to said energy density condition is decreased with increase in the thickness of said amorphous silicon film sample.

15. The apparatus for determining the laser annealing condition according to claim 13, wherein the value of the energy density added to said energy density condition is 10 mJ/cm$^2$ in the case where ratio ds/d0 of the average value ds in a thickness of the amorphous silicon film sample to standard value d0 in a thickness of the amorphous silicon thin film to which a laser annealing is applied is not smaller than 0.9 and smaller than 0.94, is 5 mJ/cm$^2$ in the case where ds/d0 ratio noted above is not smaller than 0.94 and smaller than 0.98, is 10 mJ/cm$^2$ to 40 mJ/cm$^2$ in the case where ds/d0 ratio noted above is riot smaller than 0.98 and smaller than 1.02, is −5 mJ/cm$^2$ in the case where ds/d0 ratio noted above is not smaller than 1.02 and smaller than 1.06, and is −10 mJ/cm$^2$ in the case where ds/d0 ratio noted above is not smaller than 1.06 and smaller than 1.10 and, where the ds/d0 ratio noted above is smaller than 0.90 or exceeds 1.10, the amorphous silicon thin film is not used as a substrate for determining the condition.

16. The apparatus for determining the laser annealing condition according to claim 9, wherein the attenuator transmittance of the laser beam is used in place of the energy density of said laser beam.

17. The apparatus for determining the laser annealing condition according to claim 9, wherein a plurality of said polycrystalline silicon film samples having various grain sizes are formed on a single substrate.

* * * * *